(12) United States Patent
Aoki et al.

(10) Patent No.: US 9,313,919 B2
(45) Date of Patent: Apr. 12, 2016

(54) RADIATOR, ELECTRONIC APPARATUS AND COOLING APPARATUS

(71) Applicant: FUJITSU LIMITED, Kawasaki-shi, Kanagawa (JP)

(72) Inventors: Michimasa Aoki, Kawasaki (JP); Masumi Suzuki, Kawasaki (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 227 days.

(21) Appl. No.: 13/953,937

(22) Filed: Jul. 30, 2013

(65) Prior Publication Data

US 2014/0071622 A1    Mar. 13, 2014

(30) Foreign Application Priority Data

Sep. 7, 2012    (JP) .................. 2012-197275

(51) Int. Cl.
 *H05K 7/20* (2006.01)
 *H01L 23/473* (2006.01)
 *H01L 23/467* (2006.01)

(52) U.S. Cl.
 CPC .......... *H05K 7/20163* (2013.01); *H01L 23/467* (2013.01); *H01L 23/473* (2013.01); *H01L 2924/0002* (2013.01)

(58) Field of Classification Search
 CPC ...... F28D 1/0476; F28F 9/0202; F28F 9/262; G06F 1/20
 USPC ........................ 361/679.46–679.54, 688–727; 165/80.1–80.5, 104.14, 104.26, 165/104.34, 121–126, 148–153, 182; 62/259.2; 454/184
 See application file for complete search history.

(56) References Cited

U.S. PATENT DOCUMENTS

| | | | |
|---|---|---|---|
| 6,263,957 B1 * | 7/2001 | Chen | H01L 23/473 165/104.33 |
| 6,408,939 B1 | 6/2002 | Sugimoto et al. | |
| 6,504,719 B2 * | 1/2003 | Konstad | G06F 1/20 165/104.32 |

(Continued)

FOREIGN PATENT DOCUMENTS

| | | |
|---|---|---|
| JP | 60-7576 U | 1/1985 |
| JP | 2-40495 A | 2/1990 |

(Continued)

OTHER PUBLICATIONS

Korean Office Action mailed by Korean Patent Office and corresponding to Korean Patent Application No. 10-2013-0101218 dated Aug. 21, 2014. Partial English Translation. (7 pages).

(Continued)

*Primary Examiner* — Anthony Haughton
*Assistant Examiner* — Matt Dhillon
(74) *Attorney, Agent, or Firm* — Fujitsu Patent Center

(57) ABSTRACT

A radiator includes a header including a supply chamber for a coolant to cool an electronic part mounted on a circuit board and a discharge chamber partitioned from the supply chamber, and a plurality of tubes stacked in a heightwise direction of the header, one end of each of the plurality of tubes being connected to the supply chamber and the other end of each of the plurality of tubes being connected to the discharge chamber, and the coolant flowing from the one end to the other end. The plurality of tubes include a first tube at least including a lowermost tube, and a second tube provided over the first tube and having a surface area greater than that of the first tube.

12 Claims, 10 Drawing Sheets

(56) References Cited

U.S. PATENT DOCUMENTS

| | | | | |
|---|---|---|---|---|
| 6,637,505 B1* | 10/2003 | Sasaki | ............................ | 165/122 |
| 6,967,842 B2* | 11/2005 | Aoki et al. | ..................... | 361/701 |
| 7,068,509 B2* | 6/2006 | Bash | ......................... | G06F 1/20 165/104.33 |
| 7,231,965 B2* | 6/2007 | Shimoya | .............. | F28D 1/05383 165/151 |
| 7,337,832 B2* | 3/2008 | Hu | ......................... | F28D 1/0443 165/140 |
| 7,411,785 B2* | 8/2008 | Doll | ........................... | G06F 1/20 165/104.34 |
| 7,591,302 B1* | 9/2009 | Lenehan et al. | .............. | 165/247 |
| 7,599,184 B2* | 10/2009 | Upadhya | ............ | H05K 7/20727 165/104.33 |
| 8,422,218 B2* | 4/2013 | Fried | ................... | F28D 15/0266 361/679.47 |
| 9,134,070 B2* | 9/2015 | Aoki | ....................... | F28D 1/0476 |
| 2002/0085356 A1 | 7/2002 | Ishimine et al. | | |
| 2006/0113068 A1* | 6/2006 | Desai | ..................... | F28D 1/0417 165/140 |
| 2007/0125523 A1* | 6/2007 | Bhatti et al. | .............. | 165/104.33 |
| 2008/0289802 A1 | 11/2008 | Nakajima et al. | | |
| 2009/0211743 A1* | 8/2009 | Schrader | ................ | F28D 1/0426 165/173 |
| 2011/0220336 A1* | 9/2011 | Saito | .................... | F28D 1/05391 165/173 |
| 2011/0272128 A1* | 11/2011 | Suzuki | ................... | F28D 1/0476 165/185 |
| 2012/0113584 A1* | 5/2012 | Chen | ................... | H05K 7/20781 361/679.47 |
| 2015/0241131 A1* | 8/2015 | Katoh | ................... | F28F 9/0246 165/140 |

FOREIGN PATENT DOCUMENTS

| | | |
|---|---|---|
| JP | 2000-346578 | 12/2000 |
| JP | 2002-198675 | 7/2002 |
| JP | 2007-33007 A | 2/2007 |
| JP | 2008-122058 | 5/2008 |
| JP | 2008-227150 A | 9/2008 |
| JP | 2011-237105 | 11/2011 |
| KR | 20-1998-0036001 | 9/1998 |

OTHER PUBLICATIONS

Japanese Office Action mailed on Feb. 9, 2016 for corresponding Japanese Patent Application no. 2012-197275, with Partial English Translation, 10 pages.

* cited by examiner

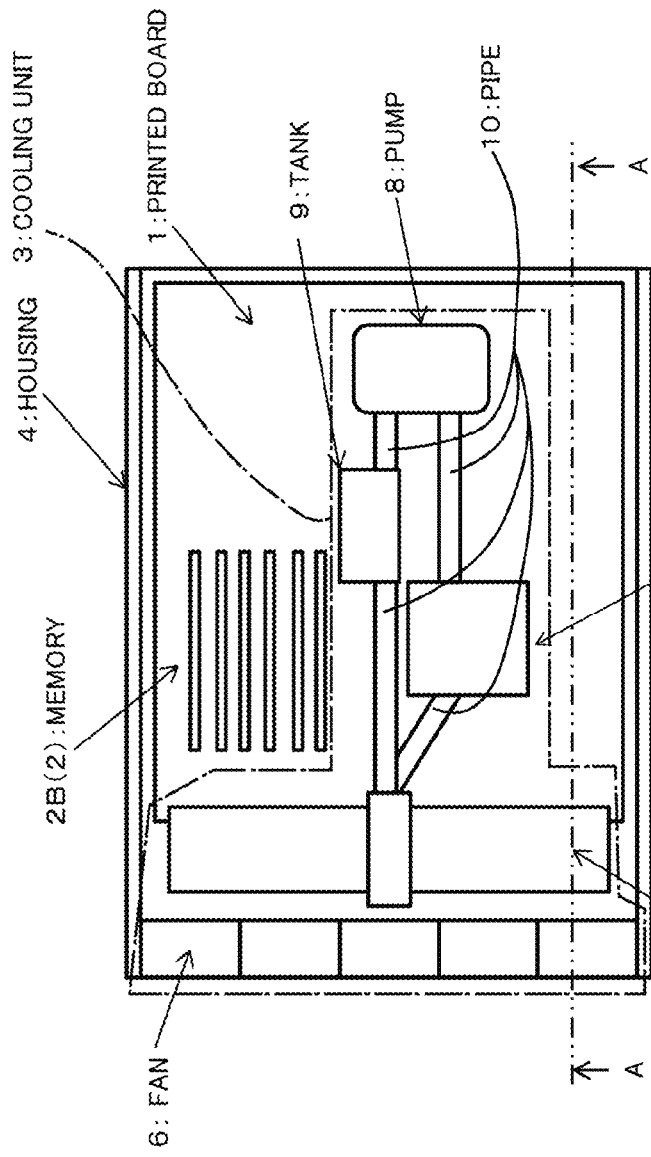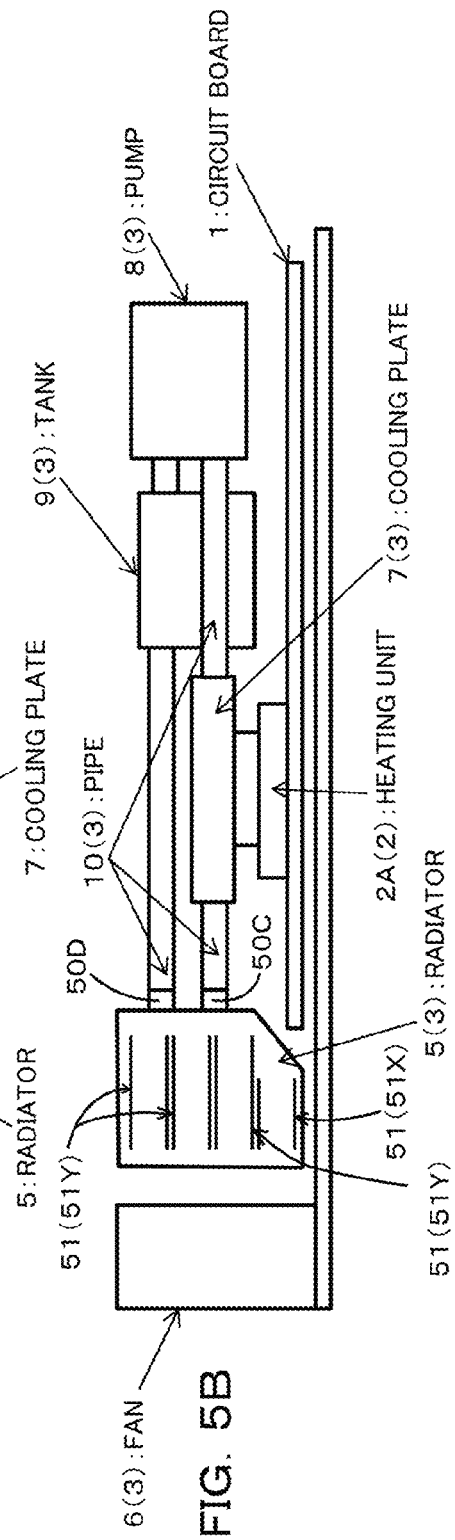
FIG. 5A
FIG. 5B

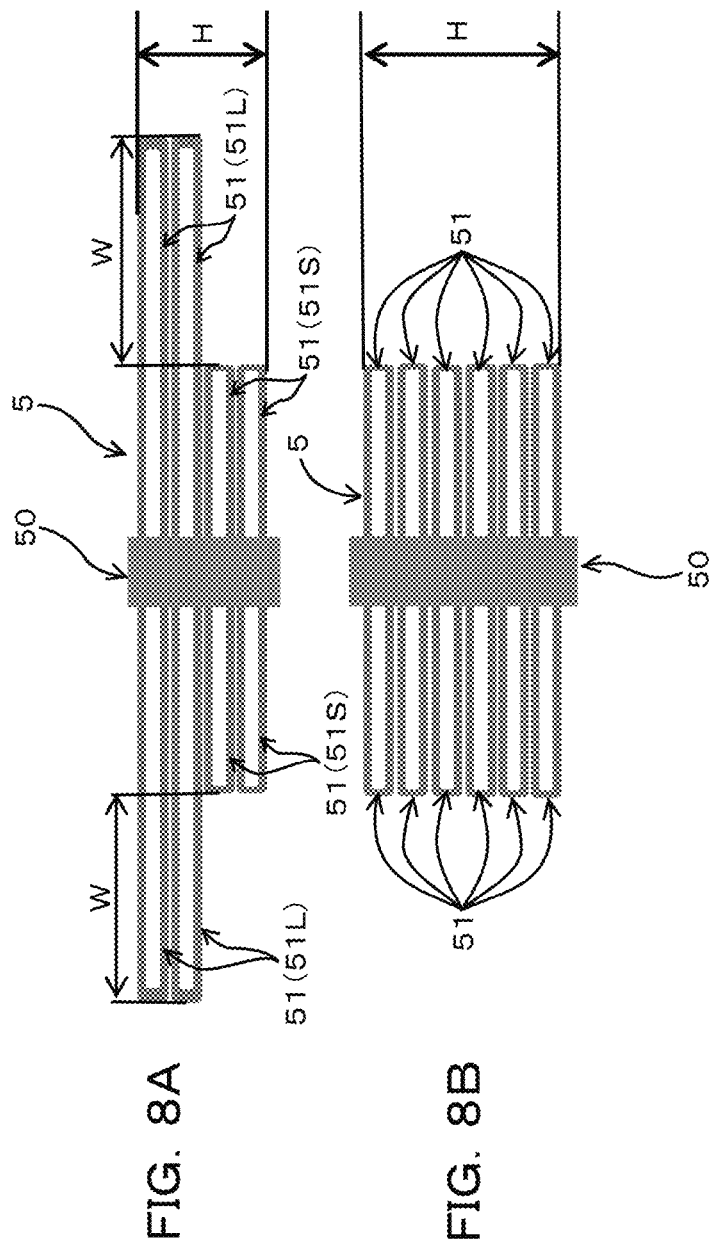

RADIATOR, ELECTRONIC APPARATUS AND COOLING APPARATUS

CROSS-REFERENCE TO RELATED APPLICATION

This application is based upon and claims the benefit of priority of the prior Japanese Patent Application No. 2012-197275, filed on Sep. 7, 2012, the entire contents of which are incorporated herein by reference.

FIELD

The embodiments discussed herein are related to a radiator, an electronic apparatus and a cooling apparatus.

BACKGROUND

A cooling apparatus to cool an electronic part (component) mounted on a circuit board is provided in an electronic apparatus.

A radiator that dissipates heat of coolant to cool an electronic part mounted on a circuit board is provided in such a cooling apparatus as described.

SUMMARY

According to an aspect of the embodiments, a radiator includes a header including a supply chamber for a coolant to cool an electronic part mounted on a circuit board and a discharge chamber partitioned from the supply chamber; and a plurality of tubes stacked in a heightwise direction of the header, one end of each of the plurality of tubes being connected to the supply chamber and the other end of each of the plurality of tubes being connected to the discharge chamber, and the coolant flowing from the one end to the other end; wherein the plurality of tubes include a first tube at least including a lowermost tube; and a second tube provided over the first tube and having a surface area greater than that of the first tube.

According to another aspect of the embodiments, an electronic apparatus includes a circuit board; an electronic part mounted on the circuit board; and a radiator to dissipate heat of a coolant to cool the electronic part; wherein the radiator has the configuration described above.

According to a further aspect of the embodiments, a cooling apparatus includes a radiator to dissipate heat of a coolant to cool an electronic part mounted on a circuit board; a fan to send air to the radiator; a cooling plate thermally connected to the electronic part; a pump to circulate the coolant; and a pipe to connect the radiator, the cooling plate and the pump to each other; wherein the radiator has the configuration described above.

The object and advantages of the embodiment will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A and 5B are schematic views depicting a configuration of a cooling apparatus and an electronic apparatus including the radiator according to the present embodiment, wherein FIG. 5A is a top plan view and FIG. 5B is a sectional view taken along line A-A of FIG. 5A;

FIGS. 6A and 6B are schematic sectional views illustrating an effect by the radiator according to the present embodiment, wherein FIG. 6A depicts a configuration of the radiator according to the present embodiment and FIG. 6B depicts a configuration of a radiator of a comparative example;

FIGS. 8A and 8B are schematic sectional views illustrating an effect by the radiator according to the first modification to the present embodiment, wherein FIG. 8A depicts a configuration of the radiator according to the first modification to the present embodiment and FIG. 8B depicts a configuration of a radiator of a comparative example;

FIGS. 9A and 9B are schematic views depicting a configuration of a cooling apparatus and an electronic apparatus according to a second modification to the present embodiment, wherein FIG. 9A is a top plan view and FIG. 9B is a sectional view taken along line A-A of FIG. 9A.

DESCRIPTION OF EMBODIMENTS

Figure 1:
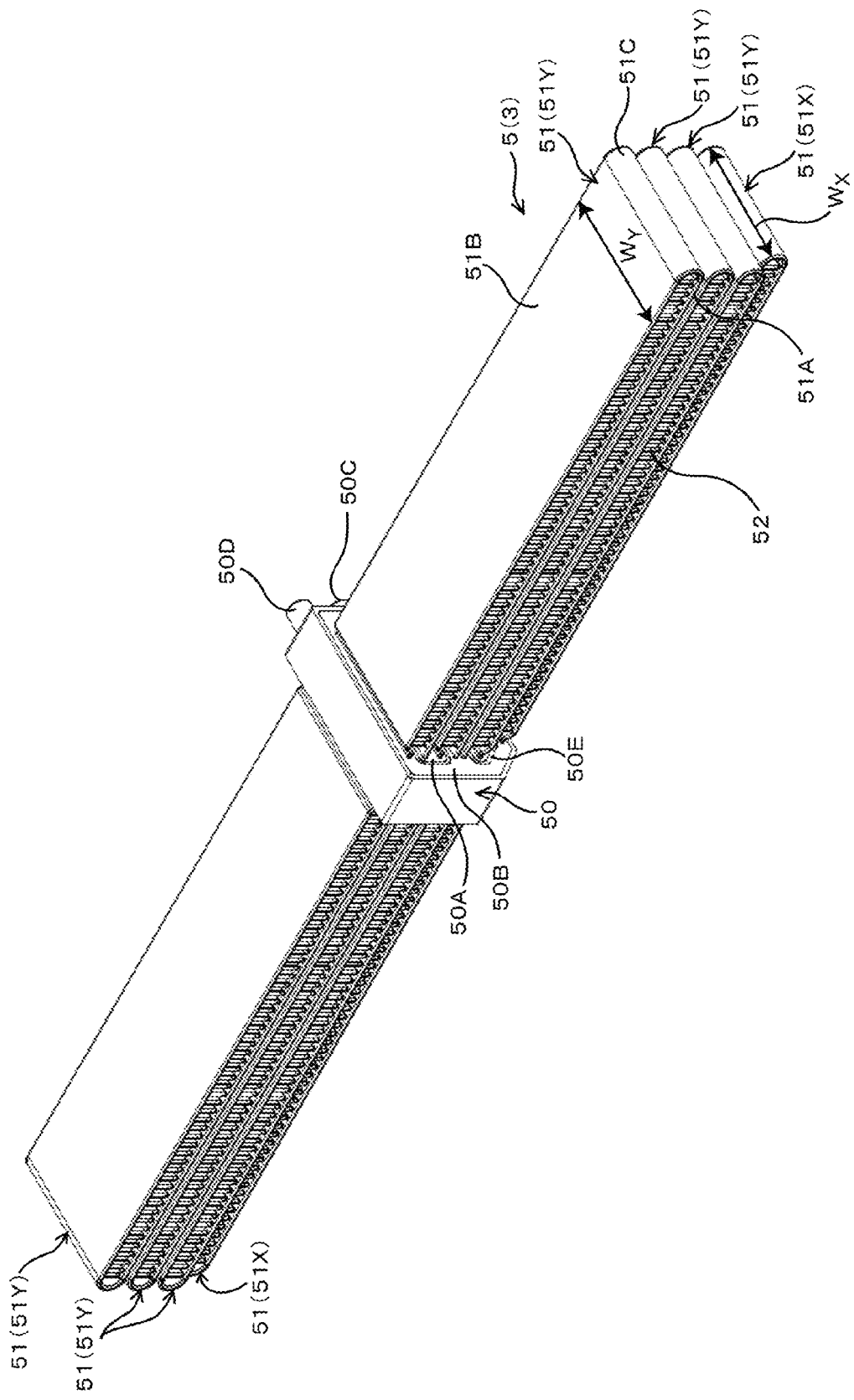
FIG. 1 is a schematic perspective view depicting a configuration of a radiator according to a present embodiment.

Incidentally, the installation space for a radiator is frequently limited in an electronic apparatus, and where a radiator is provided in the limited space, the difficulty in securing a sufficient heat dissipation is increasing.

Therefore, where a radiator is provided in a limited space, it is desired to enhance the heat dissipation of the radiator so that a sufficient cooling capacity can be secured.

In the following, a radiator, an electronic apparatus and a cooling apparatus according to an embodiment of the present invention are described with reference to FIGS. 1 to 6B.

The electronic apparatus according to the present embodiment is an electronic equipment such as, for example, a server or a personal computer (PC) of the desktop type or the notebook type (portable type).

The present electronic apparatus is, for example, a server and includes a circuit board 1, multiple electronic parts 2 mounted on the circuit board 1, and a cooling apparatus 3 to cool a electronic part included in the electronic parts 2 as depicted in FIGS. 5A and 5B. Here, the electronic apparatus is configured by accommodating the circuit board 1 on which the electronic parts 2 such as the CPU 2A and a memory (memory device) 2B are mounted and the cooling apparatus 3 to cool a CPU 2A, which is a heat generation part (heating element; heat source) and is included in the electronic parts 2 mounted on the circuit board 1, in a housing 4. It is to be noted that the cooling apparatus 3 is hereinafter referred to sometimes as cooling unit.

The cooling apparatus 3 includes a radiator 5, a fan 6, a cooling plate 7, a pump 8, a tank 9 and a pipe (line) 10. Here, multiple (one or more) fans, multiple (one or more) cooling plates, multiple (one or more) pumps, multiple (one or more) tanks and multiple (one or more) pipes may be provided as the fan 6, the cooling plate 7, the pump 8, the tank 9 and the pipe 10. In addition, the pipe includes hose, tube and so forth. The radiator 5 dissipates heat of a coolant to cool the electronic part 2 (here, the CPU 2A) mounted on the circuit board 1, and receives heat from the coolant and radiates the received heat. It is to be noted that the radiator 5 is hereinafter referred to sometimes as heat exchanger. The fan 6 sends air toward the radiator 5. It is to be noted that the fan 6 is hereinafter referred to sometimes as cooling fan. The cooling plate 7 is thermally connected to the electronic part 2 (here, the CPU 2A), and receives heat from the electronic part 2 and transfers the received heat to the coolant. The pump 8 circulates the coolant. The tank 9 accumulates the coolant therein. The pipe 10 is, for example, a metal pipe or a flexible hose. The radiator 5, cooling plate 7, pump 8 and tank 9 are connected to each other by the pipes 10. Further, while, for example, propylene glycol-based antifreeze solution may be used as the coolant, the coolant is not limited to this. It is to be noted, while the tank 9 is provided here, the present invention is not limited to this, and the tank 9 may be omitted.

Figure 2:
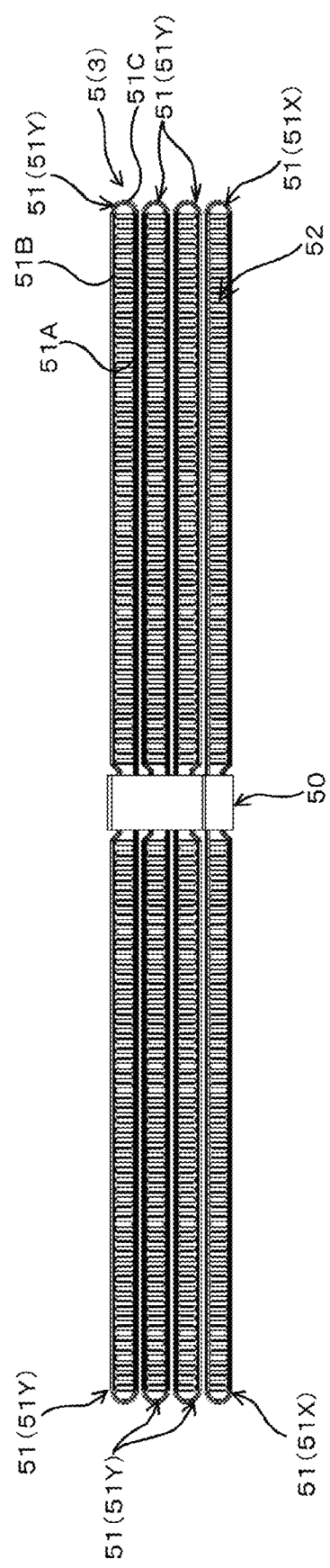
FIG. 2 is a schematic sectional view depicting the configuration of the radiator according to the present embodiment.

In the present embodiment, the radiator 5 includes a header 50 and a plurality of tubes 51 as depicted in FIGS. 1 and 2. It is to be noted here that the header 50 and the tubes 51 are formed from a metal such as, for example, aluminum.

Figure 3:
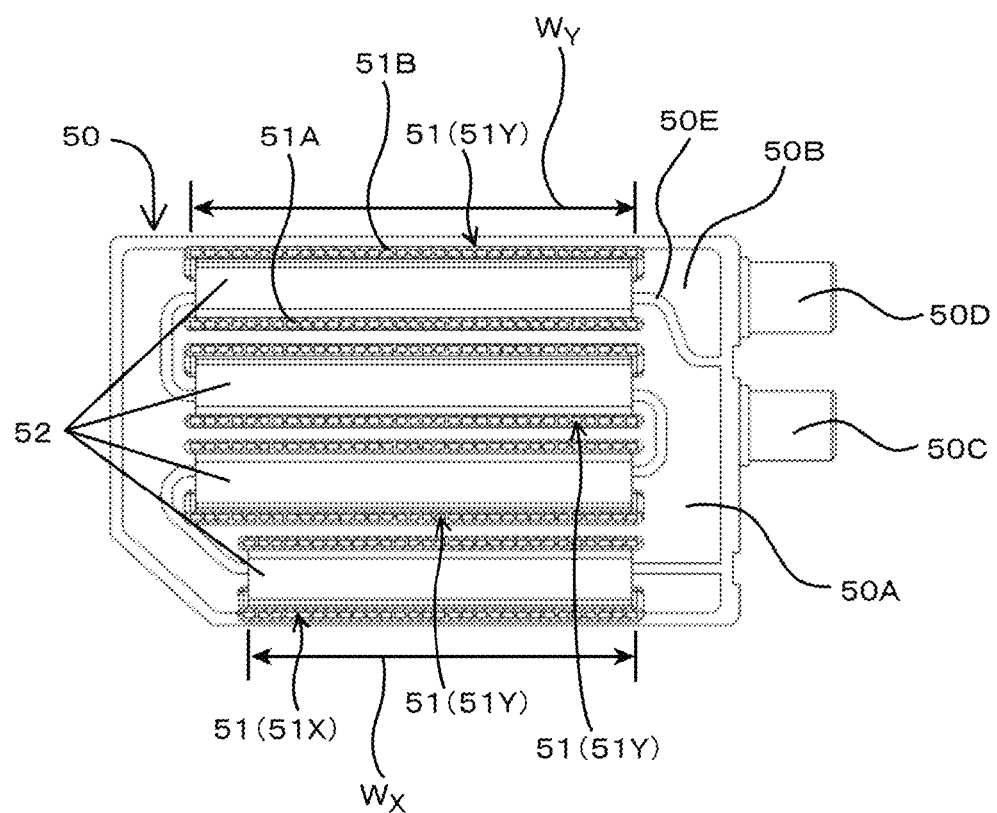
FIG. 3 is a schematic sectional view depicting a configuration of a header portion of the radiator according to the present embodiment.

Here, as depicted in FIG. 3, the header 50 includes a supply chamber 50A for a coolant, a discharge chamber 50B partitioned from the supply chamber 50A, an inlet (coolant inlet) 50C to allow the coolant to flow into the supply chamber 50A therethrough and an outlet (coolant outlet) 50D to discharge the coolant from the discharge chamber 50B therethrough. The pipe 10 (refer to FIGS. 5A and 5B) is connected to each of the inlet 50C and the outlet 50D. A partition wall 50E in the form of a flat plate is provided in the inside of the header 50 so as to meander in the upward and downward direction, namely, in the heightwise direction (in FIG. 3, the upward and downward directions), and the inside space of the header 50 is partitioned by the partition wall 50E such that the supply chamber 50A and the discharge chamber 50B are provided alternately in the upward and downward direction. In this instance, the supply chamber 50A and the discharge chamber 50B of the header 50 are provided in a displaced relationship from each other in the upward and downward direction.

Figure 4:
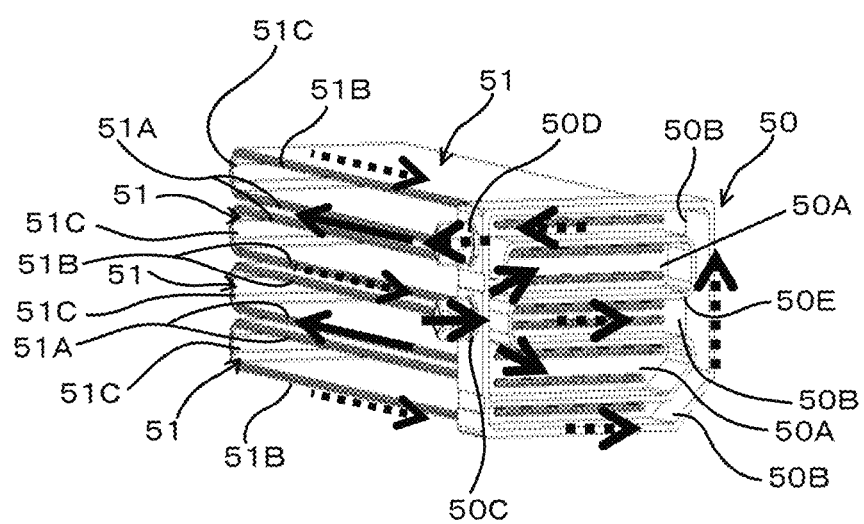
FIG. 4 is a schematic view illustrating a flow of a coolant in the radiator according to the present embodiment.

Each tube 51 has a flattened shape, and the coolant flows inside the tube 51. In particular, the tube 51 includes a flattened flow path (coolant flow path; flow channel). As depicted in FIG. 3, one end of the tube 51 is connected to the supply chamber 50A and the other end of the tube 51 is connected to the discharge chamber 50B of the header 50. The tube 51 is folded back into a loop (refer to FIGS. 1 and 2), and the coolant flows from one end to the other end of the tube 51. Further, as depicted in FIGS. 1 and 2, the tubes 51 are provided in a displaced relationship from each other in the upward and downward direction, namely, in the heightwise direction of the header 50. The tubes 51 individually have a supply chamber side portion 51A and a discharge chamber side portion 51B extending in parallel to each other in a direction away from the header 50, and a folded back portion 51C folded back into a loop in the upward and downward direction and continuing to the portions 51A and 51B. An end portion of the supply chamber side portion 51A, which is an end of the tube 51, and another end portion of the discharge chamber side portion 51B, which is the other end of the tube 51, are connected to the supply chamber 50A and the discharge chamber 50B of the header 50 provided in a displaced relationship from each other in the upward and downward direction, respectively. In particular, one end and the other end of each tube 51 are connected to positions displaced from each other in the upward and downward direction, namely, in the heightwise direction of the header 50. In this instance, as depicted in FIG. 4, the coolant flowing from the inlet 50C of the header 50 into the supply chamber 50A flows from the supply chamber 50A to the supply chamber side portion 51A of the tube 51 connected to the supply chamber 50A. Then, the coolant flows to the discharge chamber side portion 51B through the folded back portion 51C and is discharged from the outlet 50D through the discharge chamber 50B to which the discharge chamber side portion 51B is connected. Since, by using the tube 51 having such a configuration as described above, the length of the tube 51 can be secured while reduction of the height is achieved, a wide heat radiation area can be secured in a limited space and the heat dissipation capacity (cooling efficiency) can be enhanced. It is to be noted that each tube 51 is hereinafter referred to sometimes as heat dissipation portion or flow path portion.

The tubes 51 configured in such a manner as described above are stacked in the heightwise direction of the header 50. In particular, by stacking the tubes 51 in the heightwise direction of the header 50, the plurality of tubes 51 are connected at multiple stages to the header 50. Here, the plurality of tubes 51 have an equal length. The plurality of tubes 51 may be stacked with contact in the heightwise direction of the header 50, and may be stacked without contact in the heightwise direction of the header 50. In the present embodiment, the plurality of (here, four) tubes 51 are provided on each of the opposite sides of the header 50. In this instance, the radiator 5 includes the header 50 provided between the plurality of tubes 51 provided on each of the opposite sides, namely, at a central location. The heat dissipation can be enhanced by providing the plurality of tubes 51 in such a manner as described above. It is to be noted that, while the plurality of tubes 51 are provided on each of the opposite sides of the header 50 here, the present invention is not limited to this, and the plurality of tubes 51 may otherwise be provided on one side of the header 50. Further, while the lengths of the tubes 51 provided on the opposite sides of the header 50 are equal to each other, the present invention is not limited to this, and the lengths of the tubes 51 provided on the opposite sides may be made different in accordance with the installation space for the radiator 5. In this instance, the header 50 is provided at a position displaced from the central location.

Further, in the present embodiment, the tubes 51 include heat dissipation fins 52. That is, the heat dissipation fins 52 are attached in the tubes 51, respectively. In particular, the supply chamber side portion 51A and the discharge chamber side portion 51B of the tubes 51 extend in parallel to each other and in a spaced relationship from each other in the upward and downward direction, and the heat dissipation fins 52 are provided between the supply chamber side portion 51A and the discharge chamber side portion 51B. It is to be noted that the present invention is not limited to this, and the heat dissipation fins 52 may be omitted from the tubes 51. However, in comparison with an alternative case in which the heat dissipation fins 52 are not provided, the heat dissipation capacity can be enhanced where the heat dissipation fins 52 are provided.

Incidentally, in the present embodiment, as depicted in FIGS. 1 and 3, the width $W_Y$ of other tubes (here, three tubes; second tubes) 51Y provided over a lowermost tube (first tube) 51X from among the plurality of tubes 51 provided on the opposite sides of the header 50 is greater than the width $W_X$ of the lowermost tube 51X. In this instance, the sectional area of the coolant flow path of the other tubes 51Y provided over the lowermost tube 51X is greater than the sectional area of the coolant flow path of the lowermost tube 51X. In this manner, the surface area of the other tubes 51Y provided over the lowermost tube 51X from among the plurality of tubes 51 is greater than that of the lowermost tube 51X.

It is to be noted that, while, in the present embodiment, the plurality of tubes 51 provided on each of the opposite sides of the header 5 include the lowermost tube (first tube) 51X and the other tubes (here, three tubes; second tubes) 51Y having the greater width than that of the lowermost tube 51X and provided over the tube 51X, the present invention is not limited to this. For example, a configuration may be applied wherein the tubes 51 on one side from among the plurality of tubes 51 provided on each of the opposite sides of the header 50 include the lowermost tube (first tube) 51X and the other tubes (here, three tubes; second tubes) 51Y having the greater width than that of the lowermost tube 51X and provided over the lowermost tube 51X while all of the tubes 51 on the other side have an equal width and an equal length. In particular, where the plurality of tubes 51 are provided on each of the opposite sides of the header 50, at least the plurality of tubes 51 provided on one side of the header 50 or the plurality of tubes 51 provided on the other side of the header 50 may include a first tube at least including a lowermost tube 51X and a second tube having a greater width than that of the first tube and provided over the first tube (namely, a second tube having a greater surface area than that of the first tube).

In the present embodiment, the header 50 is configured such that the width of portions thereof to which the other tubes 51Y provided over the lowermost tube 51X are connected is greater than the width of a portion thereof to which the lowermost tube 51X from among the plurality of tubes 51 is connected. In this instance, the area of a cross section of the header 50 parallel to the bottom face of the header 50 at a position over the bottom face is greater than the area of the bottom face. In particular, the header 50 is different in size, namely, in width, depending upon the width of the tube 51 connected thereto. It is to be noted that it can be arbitrarily determined on which side of the header 50 in the widthwise direction (in FIG. 3, in the leftward and rightward direction) the tube 51X having a smaller width is to be provided, namely, to which side of the tubes 51Y having a greater width the tube 51X is to be adjusted. Therefore, it can be arbitrarily determined from which side of the header 50 in the widthwise direction the width of a portion of the header 50 at which the width thereof is to be reduced is reduced. For example, the width of the header 50 may be reduced from the opposite side to the side on which the inlet 50C and the outlet 50D of the header 50 are provided (refer to FIG. 3), or the width of the header 50 may be reduced from the side on which the inlet 50C and the outlet 50D of the header 50 are provided (refer to FIGS. 5A and 5B).

In this manner, while the width of the lowermost tube 51X from among the plurality of tubes 51 is reduced in accordance with the installation space (installation area) for the radiator 5 and the width of the header 50 at the portion to which the tube 51X is connected is reduced, the width of the other tubes 51Y provided over the lowermost tube 51X is made greater than that of the lowermost tube 51X so that the surface area of the tubes 51Y is increased. Consequently, the blank space at an upper location is utilized effectively to increase the heat dissipation area to enhance the heat dissipation capacity of the radiator 5. It is to be noted that enhancement of the heat dissipation capacity of the radiator 5 signifies enhancement of the cooling capacity of the cooling apparatus 3.

In particular, in the radiator 5 configured in such a manner as described above, since the width of the tubes 51 is limited by the width of the header 50, if the width of the header 50 is limited from a constraint of the installation space of the header 50, then also the width of the tubes 51 is limited, and it is difficult to enhance the heat dissipation capacity of the radiator 5. In this instance, the width of the lowermost tube 51X is reduced in accordance with the installation space of the radiator 5 and the width of the header 50 at the portion to which the tube 51X is connected is reduced while the width of the tubes 51Y over the tube 51X is increased to the surface area of the tubes 51Y. Consequently, the heat dissipation capacity of the radiator 5 can be enhanced. In particular, while the radiator 5 is installed in the limited space, the volume of the header 50 is increased and the width of the tubes 51Y over the tube 51X is increased to increase the size of the tubes 51Y so that the heat dissipation capacity of the radiator 5 can be enhanced.

Further, since the tubes 51 in the radiator 5 configured in such a manner as described above are folded back into a loop in the heightwise direction of the header 50 and the plurality of tubes 51 are stacked in the heightwise direction of the header 50, the size of the radiator 5 is likely to increase by increase of the height (thickness). In this instance, by effectively utilizing the space at an upper location as described above, the width of the upper tubes 51 is increased to increase the surface area of the upper tubes 51 to enhance the heat dissipation capacity of the radiator 5. Consequently, the number of stacked tubes 51 can be decreased and reduction in thickness and size can be implemented.

For example, it is sometimes inevitable to reduce the installation space of the radiator 5 in the housing 4 of the electronic apparatus, namely, to reduce the distance (refer to FIGS. 5A and 5B) between the fan 6 and the circuit board 1. In this instance, it is inevitable to reduce the width of the header 50 and the tubes 51 of the radiator 5 in accordance with the installation space of the radiator 5, namely, the distance between the fan 6 and the circuit board 1. Further, if the width of the header 50 of the radiator 5 is made equal in the heightwise direction and the width of the header 50 and the tubes 51 is reduced without increasing the number of stacked tubes 51 in a state in which the widths of all tubes 51 remain equal, then it is difficult to secure a sufficient heat dissipation capacity. On the other hand, if the number of stacked tubes 51 is increased in order to secure a sufficient heat dissipation capacity, then the size of the radiator 5 in the heightwise direction increases, which is not preferable. In such a case as just described, if the radiator 5 of the present embodiment configured as described above is used, then a sufficient heat dissipation capacity can be secured without increasing the size of the radiator 5 in the heightwise direction while the radiator 5 is installed in the space between the fan 6 and the circuit board 1 as depicted in FIGS. 5A and 5B so as to prevent interference with the circuit board 1. In particular, reduction in thickness (reduction in height) of the radiator 5 and enhancement of the heat dissipation capacity can be implemented while the radiator 5 is installed in the limited space avoiding the circuit board 1. In this instance, an upper portion of the header 50, namely, a portion of the header 50 to which the tubes 51Y having the increased width are connected or the tubes 51Y having the increased width, extend to a location over the circuit board 1 so as to cover the circuit board 1. In particular, the radiator 5 can be installed such that the circuit board 1 enters in a space below the header 50 or the tubes 51Y.

Further, for example, a structure such as a connector sometimes exists in a region in which the radiator 5 is to be installed, and in this instance, it is sometimes inevitable to reduce the installation space for the radiator 5. Also in this instance, it is inevitable to similarly reduce the width of the header 50 or the tube 51 of the radiator 5 in accordance with the installation space of the radiator 5. If the width of the header 50 of the radiator 5 is made equal in the heightwise direction and the width of the header 50 or the tubes 51 is reduced without increasing the number of stacked tubes 51 while the widths of all of the plurality of tubes 51 are left equal to each other, then it becomes difficult to secure a sufficient heat dissipation capacity. On the other hand, if the number of stacked tubes 51 is increased in order to secure a sufficient heat dissipation capacity, then the size of the radiator 5 in the heightwise direction increases, which is not preferable. In such a case as just described, if the radiator 5 according to the present embodiment configured in such a manner as described above is used, then a sufficient heat dissipation capacity can be secured without increasing the size of the radiator 5 in the heightwise direction while the radiator 5 is installed so as to avoid interference thereof with a structure such as a connector. In particular, the reduction in thickness (reduction in height) of the radiator 5 and enhancement of the heat dissipation capacity can be implemented while the radiator 5 is installed in the limited space and the structure such as a connector is avoided. In this instance, an upper portion of the header 50, namely, a portion of the header 50 to which the tubes 51Y having a greater width are connected, extends to a location over the structure such as a connector so as to cover the structure such as a connector. In particular, the radiator 5 can be installed such that the structure such as a connector enters in a space below the header 50 or the tubes 51Y.

Figure 6A:
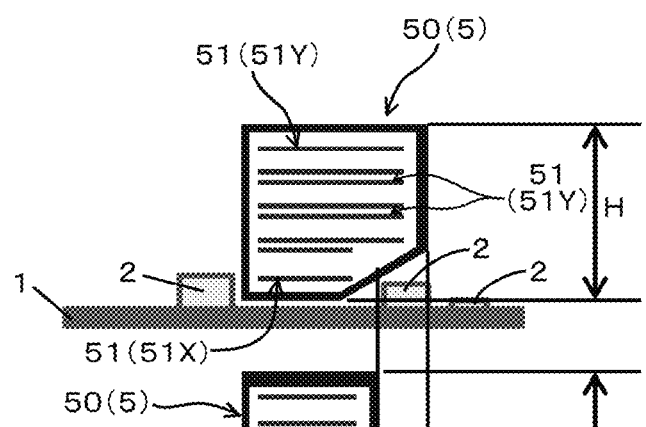
Figure 6B:
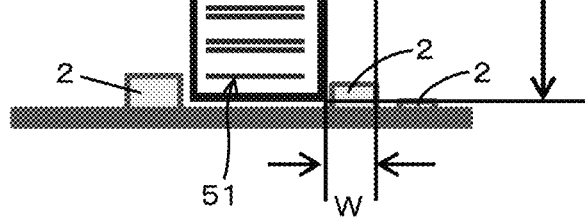

Further, for example, the radiator 5 is sometimes installed on the circuit board 1 as depicted in FIGS. 6A and 6B. In this instance, if increase of the density of electronic parts 2 (for example, chips, memories or the like) to be mounted on the circuit board 1 proceeds, then it sometimes becomes inevitable to reduce the installation space for the radiator 5. Also in this instance, it is inevitable to reduce the width of the header 50 or the tubes 51 of the radiator 5 in accordance with the installation space of the radiator 5. If the width of the header 50 of the radiator 5 is made equal in the heightwise direction and the width of the header 50 or the tubes 51 is reduced without increasing the number of stacked tubes 51 while the widths of all of the plurality of tubes 51 are left equal to each other, then it becomes difficult to secure a sufficient heat dissipation capacity. On the other hand, if the number of stacked tubes 51 is increased as depicted in FIG. 6B in order to secure a sufficient heat dissipation capacity, then the size H of the radiator 5 in the heightwise direction increases, which is not preferable. In such a case as just described, if the radiator 5 according to the present embodiment configured in such a manner as described above is used, namely, if the width of an upper portion of the header 50 and the width of the tubes 51Y provided at an upper location are increased to enlarge the surface area (heat radiation area) of the tubes 51Y as indicated by reference character W in FIG. 6A, then a sufficient heat dissipation capacity can be secured without increasing the size H of the radiator 5 in the heightwise direction while the radiator 5 is installed in the limited space so as to avoid interference of the radiator 5 with the electronic parts 2 (for example, chips, memories or the like) mounted on the circuit board 1 as depicted in FIG. 6A. In particular, the reduction in thickness (reduction in height) of the radiator 5 and enhancement of the heat dissipation capacity can be implemented while the radiator 5 is installed in the limited space avoiding the electronic parts 2. In this instance, an upper portion of the header 50, namely, a portion of the header 50 to which the tubes 51Y having a greater width are connected, extends to a location over the electronic parts 2 so as to cover the electronic parts 2. In other words, the radiator 5 can be installed while the electronic parts 2 are mounted in a space below the radiator 5, namely, below the header 50 or the tube 51Y.

It is to be noted that, while only the lowermost tube 51X in the present embodiment has a reduced width, the present invention is not limited to this, and not only the lowermost tube 51X but also the tubes 51Y over the tube 51X may be have a reduced width in accordance with the installation space for the radiator 5. In particular, those tubes 51 which are successively positioned upwardly from the lowermost tube 51 are to be formed in a reduced width may be arbitrarily determined in accordance with the installation space of the radiator 5. Therefore, the plurality of tubes 51 include a first tube at least including the lowermost tube 51X and a second tube having a width greater than that of the first tube (namely, a second tube having a surface area greater than that of the first tube) and provided over the first tube. Further, according to the header 50, the width at a portion thereof to which the second tube is connected is greater than the width at a portion thereof to which the first tube is connected. Further, at least the plurality of tubes 51 provided on one side of the header 50 or the plurality of tubes 51 provided on the other side of the header 50 include a first tube at least including the lowermost tube 51X and a second tube having a width greater than that of the first tube (namely, a second tube having a surface area greater than that of the first tube) and provided over the first tube.

Since reduction in size and thickness can be implemented by the radiator 5 according to the present embodiment configured in such a manner as described above, reduction in size and thickness of the electronic apparatus or the cooling apparatus 3 can be implemented. Therefore, it is preferable to use the radiator 5 according to the present embodiment together with small and thin electronic equipment.

Accordingly, the radiator, the electronic apparatus and the cooling apparatus according to the present embodiment exhibit an advantage that the heat dissipation capacity of the radiator 5 can be enhanced and a sufficient heat dissipation capacity can be secured also in a case in which the radiator 5 is installed in a limited space.

It is to be noted that the present invention is not limited to the embodiment specifically described above, and variations and modifications can be made without departing from the scope of the present invention.

For example, while, in the embodiment described above, a second tube having a width greater than that of the first tube is used as the second tube provided over the first tube at least including the lowermost tube 51X and having a surface area greater than that of the first tube, the present disclosure is not limited to this, and a second tube having a length greater than that of the first tube may be used. In particular, while, in the embodiment described above, the lengths of all of the tubes 51 are equal to each other and the width of the second tube is greater than that of the first tube, the present disclosure is not limited to this, and the widths of all of the tubes 51 may be equal to each other while the length of the second tube is made greater than that of the first tube. This is referred to as first modification.

Figure 7:
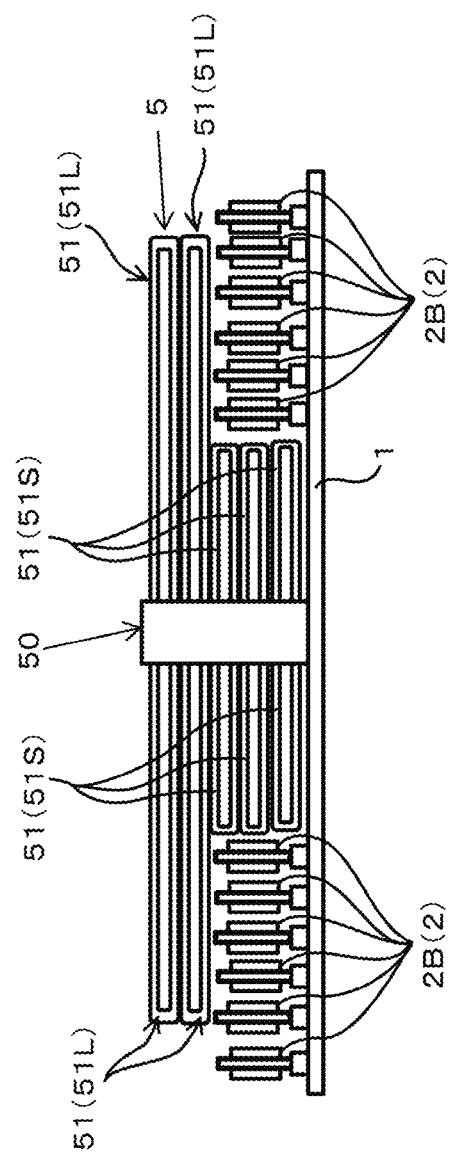
FIG. 7 is a schematic sectional view depicting a configuration of a radiator according to a first modification to the present embodiment.

For example, as depicted in FIG. 7, the radiator 5 in which a plurality of (here, five) tubes 51 are connected to each of the opposite sides of the header 50 may be configured such that the widths of all of the tubes 51 are set equal to each other and the length of two tubes 51L (second tubes) including the fourth and fifth lowermost layers is set greater than that of three tubes 51S (first tubes) including the first, second and third lowermost tubes 51S. Also in this instance, the plurality of tubes 51 include a first tube at least including a lowermost tube and a second tube provided over the first tube and having a surface area greater than that of the first tube (namely, a second tube having a length greater than that of the first tube).

It is to be noted that, since the widths of all of the tubes 51 are equal to each other, the header 50 is set such that the width thereof is equal in the heightwise direction. Here, a plurality of (here, five) tubes 51 are provided on each of the opposite sides of the header 50. In this instance, the radiator 5 includes the header 50 between the plurality of tubes 51 provided on the opposite sides, that is, at a central location. By providing the plurality of tubes 51 in such a manner as described above, the heat dissipation capacity can be enhanced.

If the radiator 5 having such a configuration as described above is used, then, for example, in a case in which the radiator 5 is provided on the circuit board 1 and increase of the density of electronic parts 2 (for example, chips, memories and so forth) to be mounted on the circuit board 1 proceeds until it becomes inevitable to reduce the installation space for the radiator 5, a sufficient heat dissipation capacity can be secured without increasing the size of the radiator 5 in the heightwise direction while the radiator 5 is installed on the circuit board 1 so as to avoid interference thereof with the electronic parts 2 (here, the memory 2B) mounted on the circuit board 1.

In particular, for example, where the radiator 5 is to be installed on the circuit board 1, if the densification of electronic parts 2 (for example, chips or memories) to be mounted on the circuit board 1 proceeds, then it is sometimes inevitable to reduce the installation space of the radiator 5. In this instance, it is inevitable to reduce the length of the tubes 51 of the radiator 5 in response to the installation space of the radiator 5. Then, if the length of the tubes 51 is reduced without increasing the number of stacked tubes 51 while the lengths of all of the tubes 51 are left equal to each other, then it becomes difficult to secure a sufficient heat dissipation capacity. On the other hand, if the number of stacked tubes 51 is increased as shown in FIG. 8B in order to secure a sufficient heat dissipation capacity, then the size H of the radiator 5 in the heightwise direction increases, which is not preferable. In such an instance, if the radiator 5 of the present invention configured in such a manner as described above is used, in other words, if the length of the tubes 51L provided at an upper portion of the header 50 is increased as indicated by a reference character W thereby to increase the surface area (heat dissipation area) of the tubes 51L in FIG. 8A, then it is possible to secure a sufficient heat dissipation capacity without increasing the size H of the radiator 5 in the heightwise direction while the radiator 5 is installed on the circuit board 1 such that the radiator 5 does not interfere with the electronic parts 2 mounted on the circuit board 1. In other words, it is possible to implement reduction in thickness (reduction in tallness) and improvement of the heat dissipation capacity of the radiator 5 while the radiator 5 is installed in a limited space avoiding the electronic parts 2. In this instance, the tubes 51L provided at an upper portion of the header 50 extend to a location over the electronic parts 2 so as to cover the electronic parts 2 as shown in FIG. 7. In other words, it is possible to install the radiator 5 while the electronic parts 2 are mounted in the space below the radiator 5, namely, below the tubes 51L. It is to be noted that, while description is given here taking a case in which the radiator 5 is installed avoiding the electronic parts 2 as an example, the radiator 5 may be installed similarly avoiding the circuit board 1 or a structure such as a connector.

It is to be noted that, although three tubes, namely, the first, second and third lowermost tubes 51S, are formed in a reduced length, the present invention is not limited to this, and those tubes 51 that are successively positioned upwardly from the first lowermost tube and are to be formed in a reduced length may be determined arbitrarily in response to the installation space of the radiator 5. Therefore, the plurality of tubes 51 include a first tube at least including a lowermost tube, and a second tube provided over the first tube and having a length greater than that of the first tube (namely, a second tube having a surface area greater than that of the first tube). Further, while the plurality of tubes 51 provided on each of the opposite sides of the header 50 include the three tubes 51S (first tubes), namely, the first, second and third lowermost tubes 51S, and other tubes 51L provided over the tubes 51S and having a length greater than that of the tubes 51S (here, two tubes, namely, the fourth and fifth lowermost tubes), the present invention is not limited to this. For example, the plurality of tubes 51 provided on one of the opposite sides of the header 50 may include three tubes 51S (first tubes), namely, the first, second and third lowermost tubes 51S, and other tubes 51L provided over the tubes 51S and having a length greater than that of the tubes 51S (here, two tubes, namely, the fourth and fifth lowermost tubes; second tubes) while all of the tubes 51 on the other side have an equal width and an equal length. In particular, where a plurality of tubes 51 are provided on each of the opposite sides of the header 50, at least the plurality of tubes 51 provided on one side of the header 50 or the plurality of tubes 51 on the other side of the header 50 may include a first tube including the lowermost tube and a second tube provided over the first tube and having a length greater than that of the first tube (namely, a second tube having a surface area greater than that of the first tube). Further, while a plurality of tubes 51 are provided on each of the opposite sides of the header 50, the present invention is not limited to this, and a plurality of tubes 51 may be provided on one side of the header 50. Further, while the lengths of the tubes 51 provided on the opposite sides of the header 50 here are equal to each other, the present invention is not limited to this, and the lengths of the tubes 51 provided on the opposite sides of the header 50 may be made different from each other in response to the installation space of the radiator 5. In this instance, the header 50 is provided at a position displaced from the central position.

The embodiment described above and the first modification described above may be combined. In particular, similarly as in the case of the embodiment described above, as the second tube provided over the first tube including at least the lowermost tube and having a surface area greater than that of the first tube, a second tube having a width greater than that of the first tube may be used, and further, as the fourth tube provided over the third tube including at least the lowermost tube and having a surface area greater than that of the third tube, a fourth tube having a length greater than that of the third tube may be used. In this instance, the plurality of tubes include the first tube including at least the lowermost tube, the second tube provided over the first tube and having a width greater than that of the first tube (namely, the second tube having a surface area greater than that of the first tube), the third tube including at least the lowermost tube and the fourth tube provided over the third tube and having a length greater than that of the third tube (namely, the fourth tube having a surface area greater than that of the third tubes). It is to be noted that the tube included in the first tube and the tube included in the third tube may be same as each other or may be different from each other. Therefore, the tube included in the second tube and the tube included in the fourth tube may be same as each other or may be different from each other. For example, in FIG. 7, the three first, second and third lowermost tubes are the third tubes, and the two fourth and fifth lowermost tubes are the fourth tubes. In this instance, if only the tube of the first lowermost layer has a smaller width, then the lowermost tube is also the first tube, and the four second to fifth lowermost tubes are also the second tubes.

For example, in the embodiment described above, the electronic apparatus wherein the circuit board 1 on which the electronic parts 2 such as the CPU 2A and the memory 2B are mounted and the cooling apparatus 3 to cool the CPU 2A, which is a heat generating part and is included in the electronic parts 2 mounted on the circuit board 1, is accommodated in the housing 4 is taken as an example. However, the present invention is not limited to this.

Figures 9A, 9B:
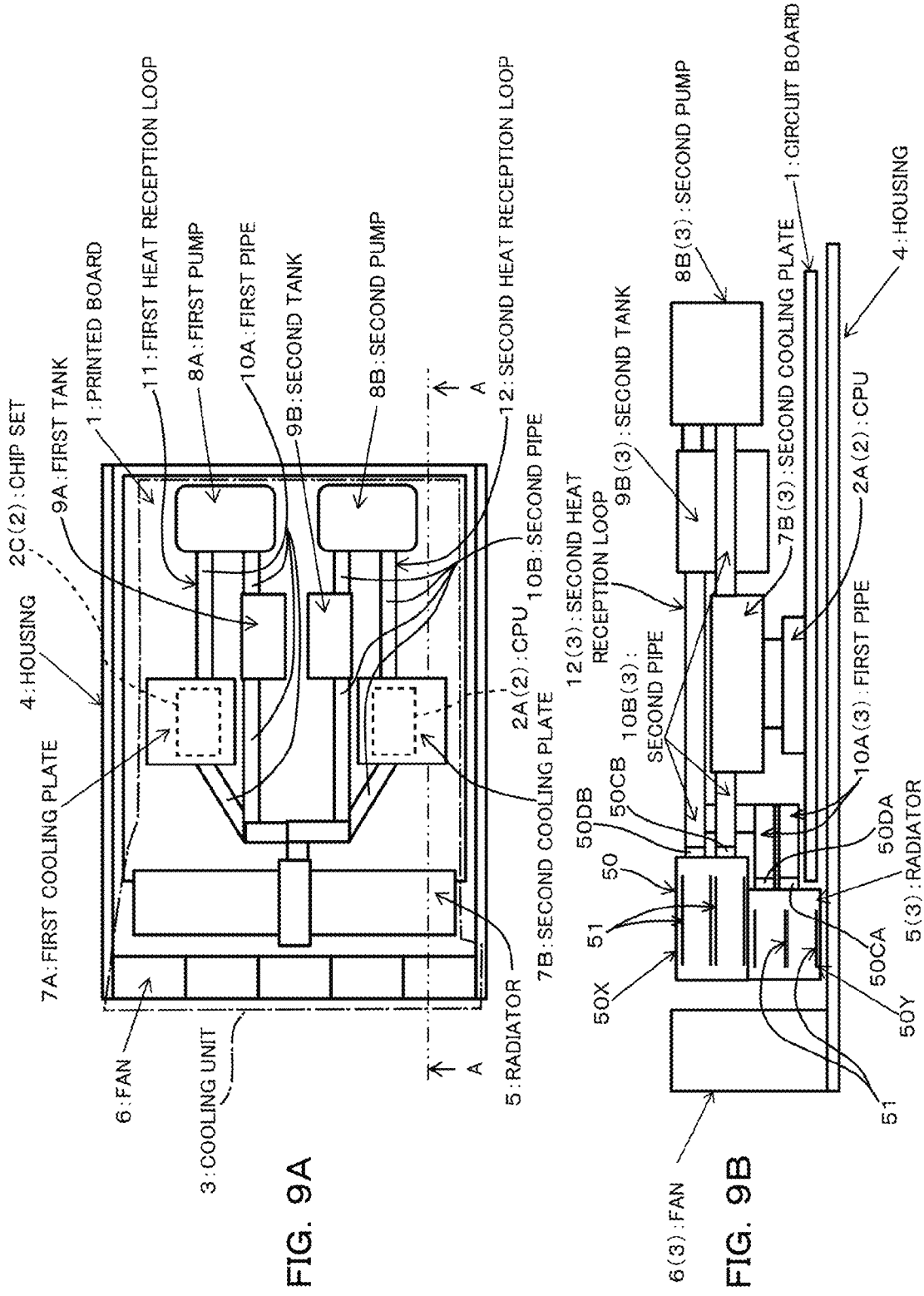

For example, the electronic apparatus may be configured otherwise such that, as depicted in FIGS. 9A and 9B, a circuit board 1 on which electronic parts 2 such as a CPU 2A and a chip set 2C are mounted, and a cooling apparatus 3 that includes a first heat reception loop 11 to cool the chip set 2C, which is a low heat generating part and is included in the electronic parts 2 mounted on the circuit board 1, and a second heat reception loop 12 to cool the CPU 2A, which is a high heat generating part and is included in the electronic parts 2 mounted on the circuit board 1, and in which the heat reception loops 11 and 12 are connected to a single radiator 5, is accommodated in the housing 4. This is referred to as second modification. Here, the high heat generating part such as the CPU 2A generates a greater amount of heat than the low heat generating part such as the chip set 2C. In other words, as the electronic parts 2, a low heat generating part (first electronic part) and a high heat generating part (second electronic part) that generates a greater amount of heat are provided.

In this instance, the cooling apparatus 3 includes the radiator 5, the fan 6, the first heat reception loop 11 and the second heat reception loop 12, and the single radiator 5 may be shared by a plurality of (here, two) heat reception loops 11 and 12.

Here, the first heat reception loop 11 includes a first cooling plate 7A, a first pump 8A, a first tank 9A, and a first pipe 10A. The first cooling plate 7A is thermally connected to the chip set 2C, which is a low heat generating part, and receives heat from the chip set 2C and transmits the heat to the coolant. Therefore, the first heat reception loop 11 may be referred to also as low heat generating part heat reception loop; the first cooling plate 7A as low heat generating part cooling plate; the first pump 8A as low heat generating part pump; the first tank 9A as low heat generating part tank; and the first pipe 10A as low heat generating part pipe.

Similarly, the second heat reception loop 12 includes a second cooling plate 7B, a second pump 8B, a second tank 9B, and a second pipe 10B. The second cooling plate 7B is thermally connected to the CPU 2A, which is a high heat generating part, and receives heat from the CPU 2A and transmits the heat to the coolant. Therefore, the second heat reception loop 12 may be referred to also as high heat generating part heat reception loop; the second cooling plate 7B as high heat generating part cooling plate; the second pump 8B as high heat generating part pump; the second tank 9B as high heat generating part tank; and the second pipe 10B as high heat generating part pipe.

In this manner, the cooling apparatus 3 includes, as cooling plates thereof, the first cooling plate 7A thermally connected to the chip set 2C, which is a low heat generating part (first electronic device), and the second cooling plate 7B thermally connected to the CPU 2A, which is a high heat generating part (second electronic device). In particular, the cooling apparatus 3 includes, as cooling plates thereof, the first cooling plate 7A thermally connected to the chip set 2C, which is a low heat generating part (first electronic device), and the second cooling plate 7B thermally connected to the CPU 2A, which is a high heat generating part (second electronic device) that generates a greater amount of heat than the chip set 2C, which is a low heat generating part. The cooling apparatus 3 further includes, as pumps thereof, the first pump 8A that circulates the coolant between the radiator 5 and the first cooling plate 7A, and the second pump 8B that circulates the coolant between the radiator 5 and the second cooling plate 7B. The cooling apparatus 3 further includes, as pipes thereof, the first pipe 10A that connects a first supply chamber and a first discharge chamber hereinafter described, the first cooling plate 7A and the first pump 8A and the second pipe 10B that connects a second supply chamber and a second discharge chamber hereinafter described, the second cooling plate 7B and the second pump 8B.

The header 50 of the radiator 5 includes a plurality of (here, two) coolant inlets 50CA and 50CB and a plurality of (here, two) coolant outlets 50DA and 50DB. In particular, the header 50 includes the first coolant inlet 50CA and the first coolant outlet 50DA to which the first pipe 10A of the first heat reception loop 11 is connected, and the second coolant inlet 50CB and the second coolant outlet 50DB to which the second pipe 10B of the second heat reception loop 12 is connected. It is to be noted that, while the first coolant inlet 50CA and the first coolant outlet 50DA as well as the second coolant inlet 50CB and the second coolant outlet 50DB are all provided on one side of the header 50, the present invention is not limited to this, and, for example, the first coolant inlet 50CA and the first coolant outlet 50DA may be provided on one side of the header 50 while the second coolant inlet 50CB and the second coolant outlet 50DB may be provided on the other side of the header 50.

The header 50 of the radiator 5 includes, as supply chambers thereof, a first supply chamber and a second supply chamber partitioned from the first supply chamber, and includes, as discharge chambers thereof, a first discharge chamber and a second discharge chamber partitioned from the first discharge chamber. Here, the header 50 is partitioned into an upper side portion 50X and a lower side portion 50Y, and the upper side portion 50X has a width greater than that of the lower side portion 50Y. Further, the first supply chamber and the first discharge chamber are provided in the lower side portion 50Y of the header 50, and the second supply chamber and the second discharge chamber are provided in the upper side portion 50X of the header 50. In other words, the lower side portion 50Y of the header 50 includes a partition wall in the form of a flat plate provided therein in such a manner as to meander in the upward and downward directions, namely, in the heightwise direction. The inner space of the lower side portion 50Y of the header 50 is partitioned by the partition wall such that the first supply chamber and the first discharge chamber are provided alternately in the upward and downward direction (refer to FIG. 3). In this instance, the first supply chamber and the first discharge chamber are provided in a displaced relationship from each other in the upward and downward direction. Similarly, the upper side portion 50X of the header 50 includes a partition wall in the form of a flat plate provided therein in such a manner as to meander in the upward and downward directions, namely, toward the heightwise direction. The internal space of the upper side portion 50X of the header 50 is partitioned by the partition wall such that the second supply chamber and the second discharge chamber are provided alternately in the upward and downward direction (refer to FIG. 3). In this instance, the second supply chamber and the second discharge chamber of the upper side portion 50X of the header 50 are provided in a displaced relationship from each other in the upward and downward direction. The first coolant inlet 50CA is provided in the first supply chamber provided in the lower side portion 50Y of the header 50, and a first coolant outlet 50DA is provided in the first discharge chamber. In particular, the first pipe 10A of the first heat reception loop 11 is connected to the first supply chamber provided in the lower side portion 50Y of the header 50 through the first coolant inlet 50CA, and the first pipe 10A of the first heat reception loop 11 is connected to the first discharge chamber through the first coolant outlet 50DA. Further, the second coolant inlet 50CB is provided in the second supply chamber provided in the upper side portion 50X of the header 50, and the second coolant outlet 50DB is provided in the second discharge chamber. In particular, the second pipe 10B of the second heat reception loop 12 is connected to the second supply chamber provided in the upper side portion 50X of the header 50 through the second coolant inlet 50CB, and the second pipe 10B of the second heat reception loop 12 is connected to the second discharge chamber through the second coolant outlet 50DB. It is to be noted that, since the first heat reception loop 11 is a low heat generating part heat reception loop, the lower side portion 50Y of the header 50 is referred to also as low heat generating part region. Further, since the second heat reception loop 12 is a high heat generating part heat reception loop, the upper side portion 50X of the header 50 is referred to also as high heat generating part region.

Further, two tubes 51 (first tubes) are connected to the lower side portion 50Y of the header 50, and two tubes 51 (second tubes) are connected also to the upper side portion 50X of the header 50. In particular, one end of each of the two tubes 51 (first tubes) connected to the lower side portion 50Y of the header 50 is connected to the first supply chamber and the other end of each of the two tubes 51 (first tubes) is connected to the first discharge chamber, and one end of each of the two tubes 51 (second tubes) connected to the upper side portion 50X of the header 50 is connected to the second supply chamber and the other end of each of the two tubes 51 (second tubes) is connected to the second discharge chamber. The two tubes 51 (second tubes) connected to the upper side portion 50X of the header 50 have a width greater than that of the two tubes 51 (first tubes) connected to the lower side portion 50Y of the header 50. Also in this instance, the plurality of tubes 51 include a first tube including at least a lowermost tube and a second tube provided over the first tube and having a width greater than that of the first tube (namely, a second tube having a surface area greater than that of the first tube). It is to be noted that, since the lower side portion 50Y of the header 50 is a low heat generating part region, the tube 51 (first tube) connected to the lower side portion 50Y is referred to also as low heat generating part tube. Meanwhile, since the upper side portion 50X of the header 50 is a high heat generating part region, the tube 51 (second tube) connected to the upper side portion 50X is referred to also as high heat generating part tube. It is to be noted that the radiator 5 configured in this manner can be regarded as a block into which a low heat generating part radiator including the lower side portion 50Y of the header 50 and the tubes 51 (first tubes) connected to the lower side portion 50Y and having a smaller width and a high heat generating part radiator including the upper side portion 50X of the header 50 and the tubes 51 (second tubes) connected to the upper side portion 50X and having a greater width are stacked vertically.

In this manner, the tubes 51 connected to the upper side portion 50X of the header 50 have a width greater than that of the tubes 51 connected to the lower side portion 50Y of the header 50, and the tubes 51 connected to the upper side portion 50X of the header 50 have a higher heat dissipation capacity. Therefore, the second heat reception loop 12 that is a high heat generating part heat reception loop is connected to the upper side portion 50X of the header 50 to which the tubes 51 having a higher heat dissipation capacity are connected while the first heat reception loop 11 that is a low heat generating part heat reception loop is connected to the lower side portion 50Y of the header 50 to which the tubes 51 having a lower heat dissipation capacity are connected. Consequently, the electronic parts 2 different in amount of heat generation (heat sources; here the CPU 2A and the chip set 2C) can be cooled in accordance with the amount of heat generation. In other words, by dissipation heat from the electronic parts 2 different in amount of heat generation using the tubes 51 different in heat dissipation capacity, cooling in accordance with the amount of heat generation can be achieved.

It is to be noted that, while the present second modification is described taking the cooling apparatus 3 in which a plurality of heat reception loops 11 and 12 are connected to the radiator 5 of the embodiment described above and the electronic apparatus which includes the cooling apparatus 3 as an example, the present invention is not limited to this. For example, also it is possible to configure the second modification otherwise as, for example, a cooling apparatus wherein a plurality of heat reception loops are connected to the radiator 5 of the first modification described above and the electronic apparatus that includes the cooling apparatus.

Figure 10:
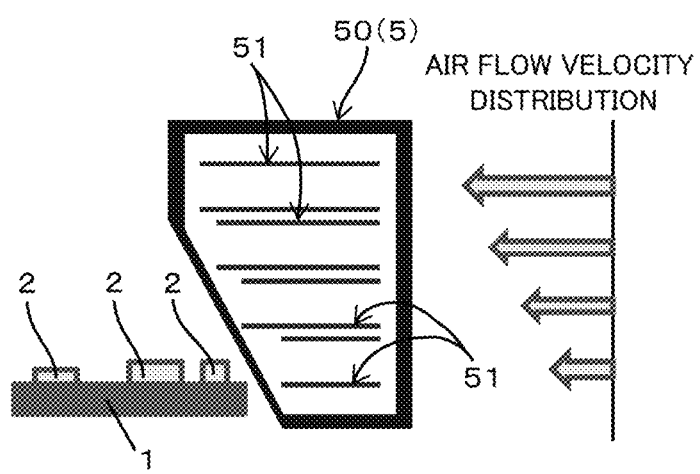
FIG. 10 is a schematic sectional view depicting a configuration of a radiator according to a third modification to the present embodiment.

Further, for example, the radiator 5 of the embodiment described above may be configured such that a plurality of tubes 51 have a surface area (here, a width) varied based on the air flow volume or the air flow velocity, as depicted in FIG. 10. This is referred to as third modification. Here, in a lower region, the electronic parts 2 and so forth are mounted and hence many obstacles exist, and therefore, the air flow volume or the air flow velocity is low, and as the space increases upwardly, the air flow volume or the air flow velocity increases. Therefore, the tubes 51 are configured such that a tube 51 positioned at a higher position has a greater surface area (here, a greater width) in accordance with the air flow volume or the air flow velocity. Since the flow of an air in the housing 4 of the electronic apparatus is non-uniform in this manner, the air flow can be utilized effectively by changing the surface areas (here, the widths) of the tubes 51 there among in accordance with the air flow volume or the air flow velocity. It is to be noted that, in the radiator 5 of the first modification described above, the plurality of tubes 51 may be formed such that they have lengths (surface areas) varied based on the air flow volume or the air flow velocity. Also in this instance, the tubes 51 include a first tube at least including a lowermost tube, and a second tube provided over the first tube and having a surface area greater than that of the first tube. It is to be noted that the configuration of the third modification and the configuration of the second modification described hereinabove may be combined.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A header including a supply chamber for a coolant to cool an electronic part mounted on a circuit board and a discharge chamber partitioned from the supply chamber; and a plurality of tubes stacked in a height wise direction of the header, one end of each of the plurality of tubes being connected to the supply chamber and the other end of each of the plurality of tubes being connected to the discharge chamber, and the coolant flowing from the one end to the other end; wherein the plurality of tubes include: a first tube at least including a lowermost tube; and a second tube provided over the first tube and having a surface area greater than that of the first tube, wherein the width of the second tube is greater than that of the first tube, the width of a portion of the header to which the second tube is connected is greater than that of another portion of the header to which the first tube is connected, and the first tube and the second tube are provided in a displaced relationship from each other in the height wise direction of the header; and the one end and the other end of each of the plurality of tubes are connected to positions displaced from each other in the height wise direction of the header, and the surface area of the plurality of tubes is varied based on an air flow volume or an air flow velocity, wherein, in the header, the supply chamber and the discharge chamber are provided alternately in the height wise direction.

2. The radiator according to claim 1, wherein the length of the second tube is greater than that of the first tube.

3. The radiator according to claim 1, wherein the plurality of tubes include:
   a third tube at least including a lowermost tube; and
   a fourth tube provided over the third tube and having a surface area greater than that of the third tube; and
   the length of the fourth tube is greater than that of the third tube.

4. The radiator according to claim 1, wherein the header includes, as the supply chamber, a first supply chamber and a second supply chamber partitioned from the first supply chamber and includes, as the discharge chamber, a first discharge chamber and a second discharge chamber partitioned from the first discharge chamber;
   one end of the first tube is connected to the first supply chamber and the other end of the first tube is connected to the first discharge chamber; and
   one end of the second tube is connected to the second supply chamber and the other end of the second tube is connected to the second discharge chamber.

5. The radiator according to claim 1, wherein the plurality of tubes are provided on opposite sides of the header, and at least one of the tubes provided on one side of the header and the tubes provided on the other side of the header includes the first tube and the second tube.

6. The radiator according to claim 1, wherein the plurality of tubes are provided on one side of the header.

7. The radiator according to claim 1, wherein each of the plurality of tubes has a heat dissipation fin.

8. An electronic apparatus comprising: a circuit board; an electronic part mounted on the circuit board; and a radiator to dissipate heat of a coolant to cool the electronic part; wherein the radiator includes: a header including a supply chamber for a coolant and a discharge chamber partitioned from the supply chamber; and a plurality of tubes stacked in a height wise direction of the header, one end of each of the plurality of tubes being connected to the supply chamber and the other end of each of the plurality of tubes being connected to the discharge chamber, and the coolant flowing from the one end to the other end; the plurality of tubes including: a first tube at least including a lowermost tube; and a second tube provided over the first tube and having a surface area greater than that of the first tube, wherein the width of the second tube is greater than that of the first tube, the width of a portion of the header to which the second tube is connected is greater than that of another portion of the header to which the first tube is connected, and the first tube and the second tube are provided in a displaced relationship from each other in the height wise direction of the header, and the one end and the other end of each of the plurality of tubes are connected to positions displaced from each other in the height wise direction of the header, and the surface area of the plurality of tubes is varied based on an air flow volume or an air flow velocity, wherein, in the header, the supply chamber and the discharge chamber are provided alternately in the height wise direction.

9. The electronic apparatus according to claim 8, further comprising:
   a fan to send air to the radiator;
   a cooling plate thermally connected to the electronic part;
   a pump to circulate the coolant; and
   a pipe to connect the supply chamber, the discharge chamber, the cooling plate and the pump to each other.

10. The electronic apparatus according to claim 9, wherein the header includes, as the supply chamber, a first supply chamber and a second supply chamber partitioned from the first supply chamber and includes, as the discharge chamber, a first discharge chamber and a second discharge chamber partitioned from the first discharge chamber;
    one end of the first tube is connected to the first supply chamber and the other end of the first tube is connected to the first discharge chamber; and
    one end of the second tube is connected to the second supply chamber and the other end of the second tube is connected to the second discharge chamber;
    the electronic apparatus further comprises:
    as the electronic part, a first electronic part and a second electronic part having a heat value higher than that of the first electronic part;
    as the cooling plate, a first cooling plate thermally connected to the first electronic part and a second cooling plate thermally connected to the second electronic part;
    as the pump, a first pump to circulate the coolant between the radiator and the first cooling plate and a second pump to circulate the coolant between the radiator and the second cooling plate; and
    as the pipe, a first pipe to connect the first supply chamber, the first discharge chamber, the first cooling plate and the first pump to each other and a second pipe to connect the second supply chamber, the second discharge chamber, the second cooling plate and the second pump to each other.

11. A cooling apparatus comprising: a radiator to dissipate heat of a coolant to cool an electronic part mounted on a circuit board; a fan to send air to the radiator; a cooling plate thermally connected to the electronic part; a pump to circulate the coolant; and a pipe to connect the radiator, the cooling plate and the pump to each other; wherein the radiator includes: a header including a supply chamber for the coolant and a discharge chamber partitioned from the supply chamber; and a plurality of tubes stacked in a height wise direction of the header, one end of each of the plurality of tubes being connected to the supply chamber and the other end of each of the plurality of tubes being connected to the discharge chamber; and the coolant flowing from the one end to the other end; the plurality of tubes including: a first tube at least including a lowermost tube; and a second tube provided over the first tube and having a surface area greater than that of the first tube, wherein the width of the second tube is greater than that of the first tube, the width of a portion of the header to which the second tube is connected is greater than that of another portion of the header to which the first tube is connected, and the first tube and the second tube are provided in a displaced relationship from each other in the height wise direction of the header, and the one end and the other end of each of the plurality of tubes are connected to positions displaced from each other in the height wise direction of the header, and the surface area of the plurality of tubes is varied based on an air flow volume or an air flow velocity, wherein, in the header, the supply chamber and the discharge chamber are provided alternately in the height wise direction.

12. The cooling apparatus according to claim 11, wherein the header includes, as the supply chamber, a first supply chamber and a second supply chamber partitioned from the first supply chamber and includes, as the discharge chamber, a first discharge chamber and a second discharge chamber partitioned from the first discharge chamber;
   one end of the first tube is connected to the first supply chamber and the other end of the first tube is connected to the first discharge chamber; and
   one end of the second tube is connected to the second supply chamber and the other end of the second tube is connected to the second discharge chamber;

the cooling apparatus further comprises:
as the cooling plate, a first cooling plate thermally connected to the first electronic part and a second cooling plate thermally connected to the second electronic part having a heat value higher than that of the first electronic part;
as the pump, a first pump to circulate the coolant between the radiator and the first cooling plate and a second pump to circulate the coolant between the radiator and the second cooling plate; and
as the pipe, a first pipe to connect the first supply chamber, the first discharge chamber, the first cooling plate and the first pump to each other and a second pipe to connect the second supply chamber, the second discharge chamber, the second cooling plate and the second pump to each other.

* * * * *